(12) United States Patent
Wen et al.

(10) Patent No.: US 8,487,294 B2
(45) Date of Patent: Jul. 16, 2013

(54) NANOSTRUCTURE QUICK-SWITCH MEMRISTOR AND METHOD OF MANUFACTURING THE SAME

(75) Inventors: Dianzhong Wen, Harbin (CN); Xiaohui Bai, Harbin (CN)

(73) Assignee: Heilongjiang University, Harbin, Heilongjiang (CN)

( * ) Notice: Subject to any disclaimer, the term of this patent is extended or adjusted under 35 U.S.C. 154(b) by 0 days.

(21) Appl. No.: 13/129,815

(22) PCT Filed: Jun. 30, 2010

(86) PCT No.: PCT/CN2010/074806
§ 371 (c)(1),
(2), (4) Date: May 18, 2011

(87) PCT Pub. No.: WO2011/000316
PCT Pub. Date: Jan. 6, 2011

(65) Prior Publication Data
US 2012/0091421 A1  Apr. 19, 2012

(30) Foreign Application Priority Data

Jul. 2, 2009  (CN) .......................... 2009 1 0072447

(51) Int. Cl.
*H01L 45/00* (2006.01)
(52) U.S. Cl.
USPC ................ 257/4; 257/2; 257/3; 257/E45.003; 257/E21.521; 438/382; 438/102; 438/103; 438/104
(58) Field of Classification Search
USPC ... 257/2–4, E45.003, E21.521; 438/102–104, 438/382
See application file for complete search history.

(56) References Cited

U.S. PATENT DOCUMENTS

2008/0090337 A1*  4/2008  Williams ...................... 438/133

* cited by examiner

*Primary Examiner* — Jami M Valentine

(57) ABSTRACT

A nanostructure quick-switch memristor includes an upper electrode, a lower electrode and three layers of nanomembrane provided between the upper electrode and the lower electrode. The three layers of nanomembrane consist of an N-type semiconductor layer, a neutral semiconductor layer on the N-type semiconductor layer, and a P-type semiconductor layer on the neutral semiconductor layer. The nanostructure quick-switch memristor of the present invention has the quick switching speed, simple manufacturing method, and low manufacturing cost.

18 Claims, 9 Drawing Sheets

$$W(t) = D - \frac{2\mu_v \rho}{A} \int_0^t I(t)dt \quad \quad \text{Formula 5}$$

Fig. 29

$$V(t) = I(t)\{R_s + \frac{R_0}{D}[D - \frac{\mu_{v1} t_1}{A} \int_0^t I(t)dt] \\ + \frac{R_0}{D}[D - \frac{\mu_{v2} \rho}{A} \int_0^t I(t)dt]\} \quad \quad \text{Formula 6}$$

NANOSTRUCTURE QUICK-SWITCH MEMRISTOR AND METHOD OF MANUFACTURING THE SAME

BACKGROUND OF THE PRESENT INVENTION

1. Field of Invention

The present invention relates to a memristor structure, and more particularly to a nanostructure quick-switch memristor.

2. Description of Related Arts

A research report shows that the nanoscale cross latch structure can flip the switch mode. This structure can be used to construct the latch circuit, and provides the probability of manufacturing the super-high density nonvolatile memory. The cross latch switch array can be used to construct the switch structure, and the switch structure is an important part of the logic circuit and an important part for communicating between the logic circuit and the memory. The new structure can significantly improve the computational efficiency of CMOS circuits.

The currently available memristor has the structure published in Pat. No. US20080090337A1. Laboratory researchers, worked in Hewlett-Packard Company (US), Dmitri B. Strukov, Gregory S. Snider, Duncan R. Stewart & R. Stanley Williams published the paper "The missing memristor found" on British Nature magazine which is published on May 1, 2008 to declare that they had proved the existence of the fourth basic component, namely, the memory resistor (abbreviated as Memristor), and had successfully designed a workable memristor physical model. Like making the sandwich, a nanoscale titanium dioxide semiconductor film $TiO_{2-x}/TiO_2$ is sandwiched between two nanowires made of Pt, thus forming the $Pt/TiO_{2-x}/TiO_2/Pt$ nanostructure. The key of manufacturing the memristor is that the size of the constituent part of the memristor is only 5 nm, namely, is only equivalent to $1/10000$ of a human hair. In fact, the known memristor manufacturing model is a nonlinear resistor with the memory function. Its resistance can be changed by controlling the current. If the high resistance is defined as "1", and the low resistance is defined as "0", then this resistor can achieve the data storage. The known memristor manufacturing model consists of a layer of nanoscale hypoxia titanium dioxide film and a layer of nanoscale neutral titanium dioxide film which are sandwiched between two Pt nanowires. Though the known memristor manufacturing model has the simple structure, its switching speed is relatively low.

SUMMARY OF THE PRESENT INVENTION

Technical Problems

To overcome the slow switching speed of the existing memristor manufacturing model, the present invention provides a nanostructure quick-switch memristor.

Technical Solution

The nanostructure quick-switch memristor of the present invention comprises an upper electrode, a lower electrode and three layers of nano-membrane, wherein the three layers of nano-membrane consist of an N-type semiconductor layer, a neutral semiconductor layer on the N-type semiconductor layer, and a P-type semiconductor layer on the neutral semiconductor layer, wherein the P-type semiconductor layer is electrically connected with the upper electrode, and the N-type semiconductor layer is electrically connected with the lower electrode.

Furthermore, the nanostructure quick-switch memristor of the present invention comprises a common electrode, two porous templates, a plurality of upper electrodes and three layers of nano-memberane which consists of an N-type semiconductor layer, a neutral semiconductor layer on the N-type semiconductor layer, and a P-type semiconductor layer on the neutral semiconductor layer, wherein each of the porous templates has a plurality of independent holes with nano-diameter which array in a matrix, and a nano-wire passes through each hole with nano-diameter, the upper surface of one porous template is connected with the lower surface of the N-type semiconductor layer, the lower surface of the porous template is connected with the common electrode, the common electrode is electrically connected with the N-type semiconductor layer by a plurality of nano-wires, the lower surface of another porous template is connected with the upper surface of the P-type semiconductor layer, a plurality of upper electrodes are fastened on the upper surface of the porous template, and each upper electrode is electrically connected with the P-type semiconductor layer by a nano-wire within the porous template.

A method of manufacturing a nanostructure quick-switch memristor comprises the steps of:

(1) evaporating a layer of Au or Pt metal membrane on a lower surface of a porous template as a common electrode by the vacuum coating method;

(2) welding a wire for connecting with a cathode of DC power supply on the evaporated metal membrane;

(3) forming a plurality of nano-wires within through-holes of the porous template by putting the porous template obtained in step (2) into an electrolytic tank to electrolyze, wherein an end of each of the nano-wires and an upper surface of the porous template are at the same level;

(4) by putting the porous template obtained in step (3) into a magnetron sputtering machine, sputtering an N-type semiconductor layer, with a thickness of 1nm to 33 nm, on the upper surface of the porous template, and then sputtering a neutral semiconductor layer with a thickness of 1 nm to 33 nm, and then sputtering a P-type semiconductor layer with a thickness of 1 nm to 33 nm;

(5) forming an upper electrode by electrically connecting the porous template having the nano-wires with the P-type semiconductor layer through the interface in situ alloying method;

(6) forming a lower electrode by electrically connecting the porous template having the nano-wires with the N-type semiconductor layer through the interface in situ alloying method;

(7) preparing a plurality of upper electrodes of the memristor on the upper surface of the porous template having the nano-wires which is connected with the P-type semiconductor layer 17, by the laser etching or imprinting technology; and (8) packaging the unit switch array of the nanostructure memristor obtained in steps (1) to (7) by packaging and testing technologies.

Furthermore, the present invention provides a nanostructure quick-switch memristor, which comprises a pair of upper electrodes, a pair of lower electrode, two nano-wires and three layers of nano-membrane, wherein the pair of upper electrodes, the pair of lower electrodes and the nano-wires center on the three layers of nano-membrane to crisscrossedly arrange, wherein the three layers of nano-membrane consist of an N-type semiconductor layer, a neutral semiconductor layer on the N-type semiconductor layer, and a P-type semiconductor layer on the neutral semiconductor layer, wherein the P-type semiconductor layer is simultaneously electrically connected with the pair of upper electrodes by a nano-wire, and the N-type semiconductor layer is simultaneously electrically connected with the pair of lower electrodes by another nano-wire.

Beneficial Effects

Compared with the structure disclosed in US20080090337A1, the present invention adds a P-type semiconductor layer 17 between two Pt nano-wires, thus forming the double-injection effect. Accordingly, it is a Pt/TiO$_{2-x}$/TiO$_2$/TiO$_{2-x}$/Pt nanostructure ultrafast memristor. It is a new memristor manufactured by the nanotechnology. It is not only a nonlinear resistor with the memory function. Its resistance can be changed by controlling the current. If the high resistance is defined as "1", the low resistance is defined as "0", then the resistor can achieve the data storage, namely, the resistor is also a basic memory which is capable of storing a bit of information. Also, (1 or 0) can be used as the switch of the memory, and especially it can provide a component model which is capable of achieving the data storage for the upcoming faster and more energy nonvolatile computers or analog computers. Moreover, the nanostructure ultrafast memristor model has the characteristic of double extension, so when the thickness of the intrinsic TiO$_2$ nano-membrane of the nanostructure ultrafast memristor model is the same as that of the structure disclosed in US20080090337A1, the present invention is improved to be nearly once the switching speed of the structure disclosed in US20080090337A1.

The nanostructure memristor of the present invention has the simple manufacturing method, low manufacturing cost, faster switching speed, and has the characteristic of more memristor states, thus it can meet the requirement of faster and faster switching speed in the current digital electric field, and provide a new memristor quick-switch component structure which is capable of achieving the data storage for the upcoming faster and more energy nonvolatile PCs or analog computers.

The ultrafast switch of the present invention has a good application prospect. Compared with the structure disclosed in US20080090337A1, the present patent makes up for the shortage of the slow switching speed, and provides a new ultrafast memristor model for the upcoming faster and more energy nonvolatile computers or circuits.

BRIEF DESCRIPTION OF THE DRAWINGS

FIG. 29 is formula five.

FIG. 30 is formula six.

DETAILED DESCRIPTION OF THE PREFERRED EMBODIMENT

Embodiment 1

Figure 19:
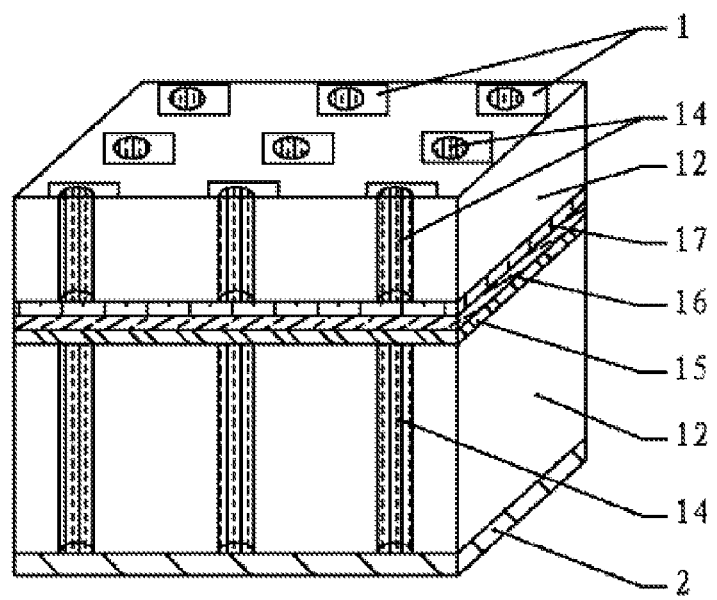
FIG. 19 is a schematic view of a nanostructure memristor array according to a first embodiment of the present invention.

Referring to FIG. 19 of the drawings, a nanostructure quick-switch memristor according to a first preferred embodiment of the present invention is illustrated, wherein the nanostructure quick-switch memristor comprises a plurality of upper electrodes 1, a plurality of lower electrodes 2 and three layers of nano-membrane. The three layers of nano-membrane consist of an N-type semiconductor layer 15, a neutral semiconductor layer 16 on the N-type semiconductor layer 15, and a P-type semiconductor layer 17 on the neutral semiconductor layer 16. The P-type semiconductor layer 17 is electrically connected with the upper electrodes 1, and the N-type semiconductor layer 15 is electrically connected with the lower electrodes 2.

In the nanostructure quick-switch memristor mentioned above, a switch junction is provided between the upper electrodes 1 and the lower electrodes 2. The switch junction has a layer of switchable substance which is capable of switching between two stable states. The switch junction of the ultrafast memristor in the first embodiment of the present invention is achieved by the three layers of nano-membrane. The three layers of nano-membrane consist of an N-type semiconductor layer 15, a neutral semiconductor layer 16 on the N-type semiconductor layer 15, and a P-type semiconductor layer 17 on the neutral semiconductor layer 16. The upper electrodes 1 and the lower electrode 2 can be made of metal or semiconductor. In general, the electrode is made of metal, and especially platinum. The switch junction of the ultrafast memristor is provided between two metal wires.

The three layers of nano-membrane of the first embodiment of the present invention have the same or different thicknesses. The total thickness of the three layers of nano-membrane is smaller than 100 nm and larger than 3 nm.

In the first embodiment of the present invention, the thickness of each layer of nano-membrane is in the range of 1 nm to 33 nm, generally, 5 nm to 26 nm, preferably, 26 nm±5 nm.

Figure 2:
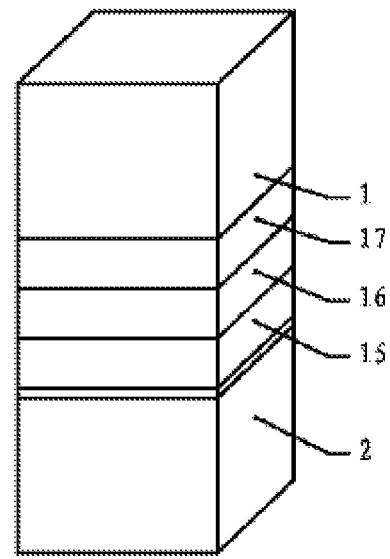
FIG. 2 is an ideal schematic view of the nanostructure quick-switch memristor having a contact potential barrier between metal and semiconductor materials.

For the nanostructure quick-switch memristor mentioned in the first preferred embodiment of the present invention, during the actual production process, a contact potential barrier between the metal and the semiconductor material 20 is provided between the N-type semiconductor layer 15 and the lower electrode 2, referring to FIG. 2.

In the first embodiment of the present invention, the P-type semiconductor layer 17 is electrically connected with the upper electrodes 1 by the nano-wires which are made of Pt, and the N-type semiconductor layer 15 is electrically connected with the lower electrodes 2 by the nano-wires which are made of Pt.

The N-type semiconductor layer 15 is made of $TiO_{2-x}$ hypoxia nano-materials, the neutral semiconductor layer 16 is made of $TiO_2$ neutral nano-materials, and the P-type semiconductor layer 17 is made of $TiO_{2+x}$ oxygen-enriched nano-materials.

Molecular formula $TiO_{2-x}$ means that a part of oxygen atoms are absent in $TiO_2$ crystal structure where is charged positively, molecular formula $TiO_{2-x}$ means that a part of oxygen atoms are additional in $TiO_2$ crystal structure where is charged negatively, and here, doping impurities are generally Fe and oxygen atoms by ion implantation.

The feature size of the quick-switch memristor according to the first preferred embodiment of the present invention can reach nanoscale, its side length can be several nanometer, submicron, or micron scale.

The characteristics and working principle of the ultrafast memristor are briefly introduced as below.

The main working layer of the switch junction of the ultrafast memristor can be made of semiconductor, insulator or weak ionized conductor. By transmitting and storing ions, the main working layer controls the current which passes through the switch junction of the ultrafast memristor. The basic work mode of the ultrafast memristor is described as follows. Applying an enough electric field to two ends of the switch junction so as to change the conductivity of the main working area from the low conductivity (OFF mode) to the high conductivity (ON mode) or from the high conductivity (ON mode) to the low conductivity (OFF mode), wherein the electric field enables the ions to enter or leave the main working area. Furthermore, by choosing the materials of the main working layer and the species of doping ions, the ions are injected into or extracted from the main working layer, and also, the speed of injection or extraction is not too fast, so that the switch junction of the ultrafast memristor has enough time to be kept at the switch-on/off mode. Therefore, the nonvolatility of the ultrafast memristor will be ensured, namely, the switch junction can maintain the original state after removing the electric field for a period of time. When a high voltage is applied to two ends of the ultrafast memristor, the ultrafast memristor will be turned on, but when a low voltage is applied to two ends of the ultrafast memristor, the ultrafast memristor will be turned off.

The principle of changing the conductivity of the working layer of the ultrafast memristor is described as below.

The secondary working layer is the doping source of the main working layer. The doping ions can be H, AL, N, Fe or transition metal. Under the effect of drift field, the doping ions can pass in or out the main working layer so as to change the conductivity of the main working layer.

In generally, the main working layer has a nano-crystal, nano-porous or amorphous structure. Its thickness is very small (commonly smaller than 50 nm).

Because ions easily diffuse at the boundary, pore or defect of the amorphous structure, the mobility of the ions in these nanostructures is much higher than that in the lattice structure. Furthermore, the nano-layer is very thin, so it takes doping ions a short time to pass in or out the main working layer. Therefore, the conductivity of the main working layer changes quickly.

The electrodes at two ends of the main working layer and the secondary working layer of the switch junction of the ultrafast memristor can be made of metal, or the electrode at one end is made of metal, and the electrode at the other end is made of semiconductor. The main working layer is made of the weakly ionized semiconductor into which the doping ion can diffuse, and the secondary working layer is the doping source of the main working layer. Furthermore, the main working layer can be made of the weakly ionized semiconductor or insulator, and a non covalent bond interface is provided within the switch junction of the ultrafast memristor. Metal contacts semiconductor thus forming the Schottky barrier. When the feature size of the material is nano-scale, the traditional description of the Schottky barrier will be modified, and here, the structure and electric characteristics will be changed.

The transmission capacity of the doping ion in the ultrafast memristor is determined by the electron tunneling in the quantum mechanics. When enough doping ions enter the main working layer, the height and width of the tunnel barrier will be reduced, the conductivity of the ultrafast memristor will be increased, and here, the memristor will be turned on. When the main working layer is at the intrinsic state, the tunnel barrier will be high and wide, and here, the conductivity of the ultrafast memristor will be low and turned off.

If a contact surface of the switch junction and the metal or semiconductor electrode of the ultrafast memristor has a non covalent bond, then the speed of the impurity passing in or out the main working layer will be significantly improved. This non covalent bond contact surface may be formed by defects or molecular layers which can not form the covalent bond with the electrode or main working layer in the material. It reduces the energies which are required while the ions pass in or out the main working layer. Because the non covalent bond contact surface is essentially a layer of very thin insulator, the total series resistance of the ultrafast memristor is increased.

The mobility and diffusion coefficient of the impurity in the strongly ionized conductor are very large, because the impurity can diffuse, the switch made of the strongly ionized conductor can not retain the stable state. Seen from above description, the ultrafast memristor is made of weakly ionized conductor. The mobility and diffusion coefficient of the impurity in the weakly ionized conductor are very small, so the switch junction of the ultrafast memristor can retain the switch-on/off mode for a long time under certain conditions. Based on the Einstein equation, it is known that the mobility of the impurity ion in the crystal lattice is in direct proportion to the diffusion coefficient of the impurity ion in the crystal lattice. If the mobility of the impurity ion in the crystal lattice is very high, the diffusion coefficient of the impurity ion will be large. As required, the switch junction of the ultrafast memristor remains the switch-on/off mode for different time which is from several seconds to several years. In practice, the ultrafast memristor is made of weakly ionized conductor whose inner impurity ions have a lower diffusion coefficient, so that the ultrafast memristor can retain the stable state. Therefore, the ultrafast memristor is avoided to change from switch-on to switch-off or from switch-off to switch-on, due to the diffusion of the impurity ion.

Combined with the characteristics and working principle of the ultrafast memristor mentioned above, the switch-on/off working principle of the nanostructure quick-switch memristor according to the first preferred embodiment of the present invention is described, referring to FIGS. 1 to 14.

Figure 1:
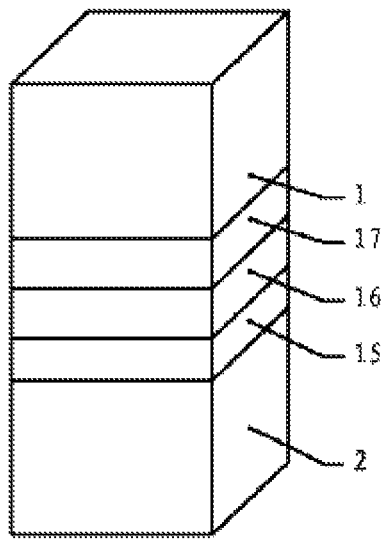
FIG. 1 is an ideal schematic view of a nanostructure quick-switch memristor.

FIG. 1 is an ideal structural schematic view of a nanostructure quick-switch memristor. FIG. 2 is an ideal structural schematic view of the nanostructure quick-switch memristor having a contact barrier which is provided between the metal and the semiconductor material. According to FIGS. 1 and 2, the switch-on/off working principle of the nanostructure quick-switch memristor of the present invention is described as below.

Figure 3:
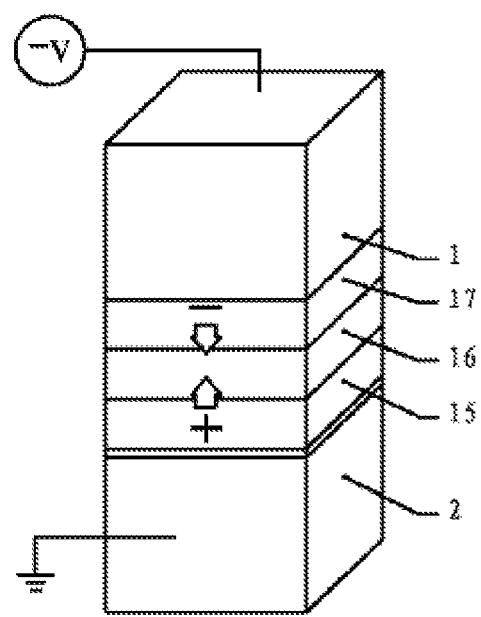
FIG. 3 is a three-dimensional schematic view of the nanostructure quick-switch memristor when the unit switch of the memristor starts or switches to the open state.

Based on the nanostructure quick-switch memristor of FIG. 2, the unit switch of the memristor starts or switches to the switch-on mode, referring to FIG. 3. The upper electrode 1 is connected with the cathode of direct current (DC) power supply, and the lower electrode 2 is connected with the ground of DC power supply. Therefore, under the effect of the electric field, the negative charges move along the P-type semiconductor layer 17 to the neutral semiconductor layer 16. Simultaneously, the positive charges move along the N-type semiconductor layer 15 to the neutral semiconductor layer 16. Here, the unit resistance of the nanostructure quick-switch memristor is largest, namely, the quick-switch memristor is at the switch-off mode.

As shown in FIG. 3, when the N-type semiconductor layer 15 is made of $TiO_{2-x}$ hypoxia nano-materials, the neutral semiconductor layer 16 is made of $TiO_2$ neutral nano-materials, and the P-type semiconductor layer 17 is made of $TiO_{2+x}$ oxygen-enriched nano-materials, under the effect of the electric field, the $TiO_{2-x}$ hypoxia nano-layer 310 and the $TiO_{2+x}$ oxygen-enriched nano-layer inject simultaneously carriers to the $TiO_2$ neutral nano-layer (as shown by arrows). At the initial state, $TiO_2$ nano-layer is neutral, and the carriers in the nano-layer are completely exhausted, so the nano-layer obtains net charges at this point. The potential difference between the electrode and secondary working area will form the tunnel barrier between the Pt metal electrodes. The amount of carriers in the $TiO_2$ neutral nano-layer and the conductivity thereof are increased, and the conductivities of $TiO_{2+x}$ oxygen-enriched nano-layer and $TiO_{2-x}$ hypoxia nano-layer are very high, so they are very good electric conductors. Here, the ultrafast memristor is at the switch-on mode.

The conductivities of $TiO_{2+x}$ oxygen-enriched nano-layer and $TiO_{2-x}$ hypoxia nano-layer have a small change, and the reason is that they only lose very small amount of carriers. However, the conductivity of $TiO_2$ neutral nano-layer has a very large change, and the reason is that the amount of charges of $TiO_2$ neutral nano-layer develops from nothing.

Figure 4:
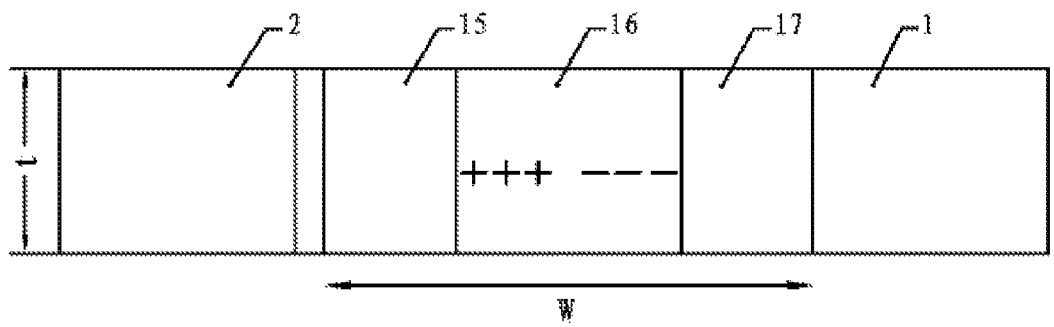
FIG. 4 is a planar schematic view of the unit switch of the nanostructure quick-switch memristor at the switch-on mode shown in FIG. 3.
Figure 5:
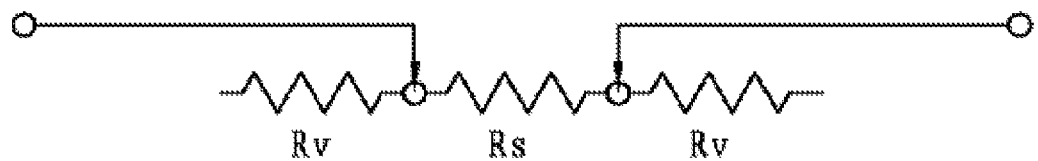
FIG. 5 is an equivalent circuit diagram of FIG. 4.
Figure 6:
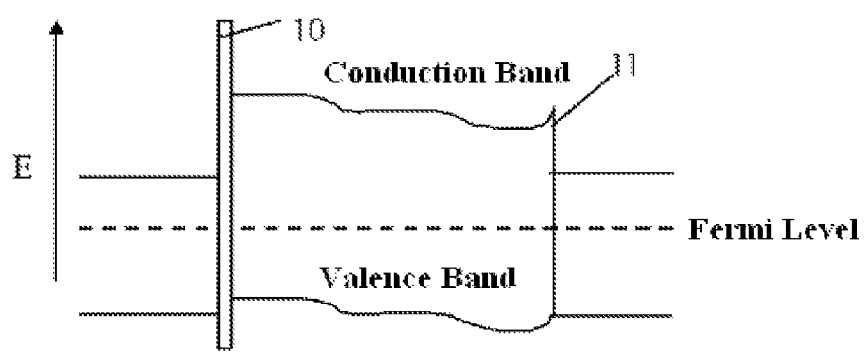
FIG. 6 is an energy band diagram of the unit switch of the nanostructure quick-switch memristor at the switch-on mode.

FIG. 4 is a planar schematic view of the switch of the nanostructure quick-switch memristor at the switch-on mode, wherein W denotes the thickness of three layers of nano-membrane, and t denotes the side length or diameter of the cross section of the unit switch of the nanostructure quick-switch memristor. FIG. 5 is an equivalent circuit diagram of FIG. 4, wherein Rv denotes the equivalent resistance of the P-type semiconductor layer 17 or N-type semiconductor layer 15, and Rs denotes the equivalent resistance of the neutral semiconductor layer 16. FIG. 6 is an energy band diagram of the unit switch of the nanostructure quick-switch memristor at the switch-on mode, wherein y-coordinate E is energy level, 10 denotes the contact potential barrier of metal and the P-type semiconductor layer 17, and 11 denotes the contact potential difference of metal and the N-type semiconductor layer 15.

When the N-type semiconductor layer 15 is made of $TiO_{2-x}$ hypoxia nano-materials, the neutral semiconductor layer 16 is made of $TiO_2$ neutral nano-materials, and the P-type semiconductor layer 17 is made of $TiO_{2+x}$ oxygen-enriched nano-materials, if the bias voltage applied to two ends of the switch junction of the memristor is increased or maintained for a longer time, more carriers will be injected into the neutral semiconductor layer 16. Referring to FIG. 6, compared with the intermediate state, at this point, the semiconductor energy band is bent more severely, the electric barrier is lower, the conductivity is higher, and the memristor is entirely switched on. However, at this point, if the upper electrode 1 is connected with ground, the lower electrode 2 is connected with the negative electricity, the carriers will come back to the $TiO_{2+x}$ oxygen-enriched nano-layer 17 and $TiO_{2-x}$ hypoxia nano-layer 15, and the ultrafast memristor will come back to the switch-off mode.

We can see from the above description that a non covalent nano-layer, provided between the upper electrode 1 and the $TiO_{2+x}$ oxygen-enriched nano-layer 17, has a negative effect, thus forming the Schottky barrier. A non-covalent bond is provided within the contact surface of the upper electrode 1 and the $TiO_{2+x}$ oxygen-enriched nano-layer 17, and impurity ions are prone to move towards the contact surface, so that the $TiO_{2+x}$ oxygen-enriched nano-layer 17 is kept at the amorphous state by the non covalent nano-layer.

Figure 7:
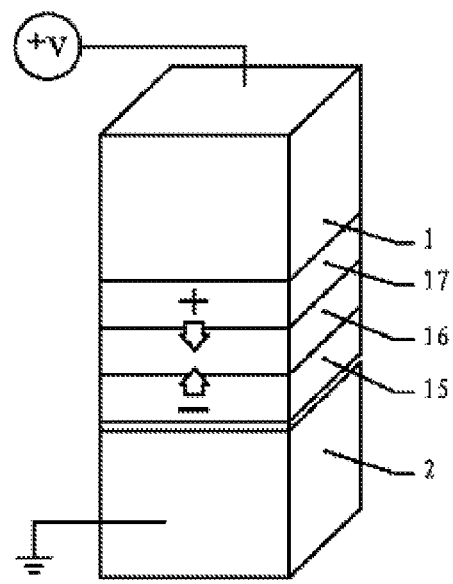
FIG. 7 is a three-dimensional schematic view of the nanostructure quick-switch memristor when the unit switch of the memristor starts or switches to the closed state.

Referring to FIG. 7, the working principle of the nanostructure quick-switch memristor at the switch-on/off mode is illustrated. The upper electrode 1 is connected with the anode of DC power supply, and the lower electrode 2 is connected with ground of DC power supply. Accordingly, under the effect of the electric field, the negative charges move along the neutral semiconductor layer 16 to the P-type semiconductor layer 17, and simultaneously, the positive charges move along the neutral semiconductor layer 16 to the N-type semiconductor layer 15.

When the N-type semiconductor layer 15 is made of $TiO_{2-x}$ hypoxia nano-materials, the neutral semiconductor layer 16 is made of $TiO_2$ neutral nano-materials, and the P-type semiconductor layer 17 is made of $TiO_{2+x}$ oxygen-enriched nano-materials, as shown in FIG. 7, under the effect of the electric field, the $TiO_{2-x}$ hypoxia nano-layer and the $TiO_{2-x}$ oxygen-enriched nano-layer extract simultaneously impurity ions from the $TiO_2$ neutral nano-layer, namely, the $TiO_{2-x}$ hypoxia nano-layer and the $TiO_{2+x}$ oxygen-enriched nano-layer have a higher impurity concentration and conductivity, and are good conductors. However, at this point, the $TiO_2$ nano-layer loses net charges and turn to be neutral. The conductivities of the $TiO_{2-x}$ hypoxia nano-layer and $TiO_{2+x}$ oxygen-enriched nano-layer change little, but the conductivity of the $TiO_2$ nano-layer decreases sharply, and here the ultrafast memristor is at the switch-off mode.

We can see from Quantum mechanics that impurity ions pass in or out the main working layer by tunnel effect. When the semiconductor material has the intrinsic nature, the tunnel is hard to be passed through, so the switch has the low conductivity (OFF). When a great amount of impurities are injected into the semiconductor, the tunnel barrier will be decreased, which will increase the conductivity (ON).

When a great amount of impurities are injected into the nano-layer, the tunnel effect will be decreased, the resistivity will be lowered, the conductivity will be increased, and the ultrafast memristor is at the switch-on mode. When the nano-layer is intrinsic, the tunnel effect is high, the resistivity is high, and the ultrafast memristor is at the switch-off mode.

Figure 8:
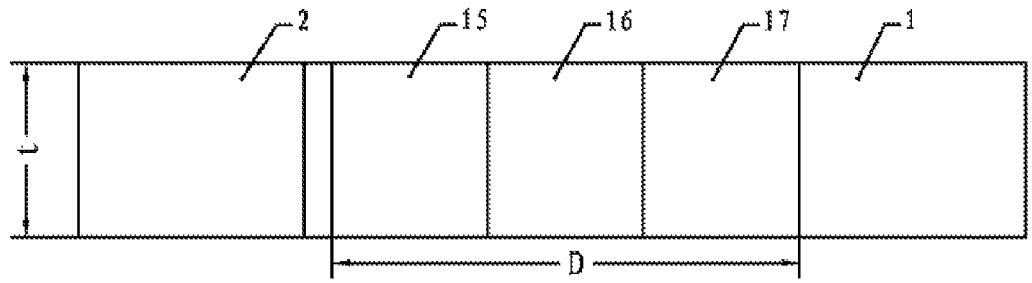
FIG. 8 is a planar schematic view of the unit switch of the nanostructure quick-switch memristor at the switch-off mode.
Figure 9:
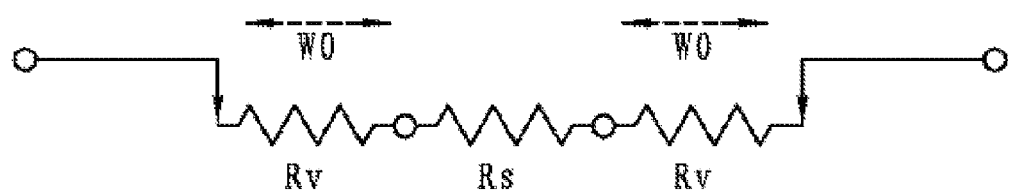
FIG. 9 is an equivalent circuit diagram of FIG. 8.
Figure 10:
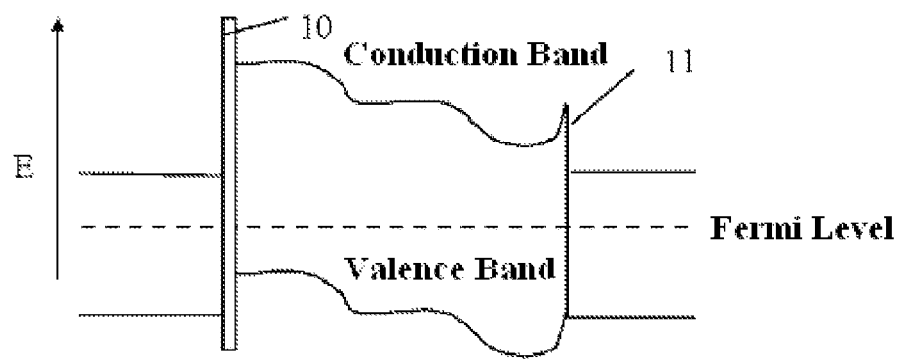
FIG. 10 is an energy band diagram of the unit switch of the nanostructure quick-switch memristor at the switch-off mode.

FIG. 8 is a planar schematic view of the unit switch of the nanostructure quick-switch memristor at the switch-off mode, wherein D denotes the original thickness of three layers of nano-membrane at this mode, and t denotes the side length or diameter of the cross section of the unit switch of the nanostructure quick-switch memristor. The cross section of the unit switch of the memristor can be a square, or other shapes. FIG. 9 is an equivalent circuit diagram of FIG. 8, wherein $W_0$ denotes the thickness of the P-type semiconductor layer 17 or the N-type semiconductor layer 15 at this point. FIG. 10 is an energy band diagram of the unit switch of the nanostructure quick-switch memristor at the switch-off mode.

When the N-type semiconductor layer 15 is made of $TiO_{2-x}$ hypoxia nano-materials, the neutral semiconductor layer 16 is made of $TiO_2$ neutral nano-materials, and the P-type semiconductor layer 17 is made of $TiO_{2+x}$ oxygen-enriched nano-materials, the upper electrode 1 is connected with the positive electricity, the lower electrode 2 is connected with ground, the three layers of nano-membrane 15, 16 and 17 provided between the upper electrode and the lower electrode form a sandwich structure, and a non covalent nano-layer is formed between the P-type semiconductor layer 17 which is made of $TiO_{2+x}$ oxygen-enriched nano-materials and the upper electrode 1. A qualitative figure of electric states of the system at the switch-off mode is given based on the band approximation Impurities within the crystal lattice have a doping concentration of 1020 cm$^{-3}$. Metal contacts semiconductor, thus forming the Schottky barrier. When the feature size of material is nano-scale, the traditional description of the Schottky barrier is needed to be modified, and here, the structure and electric characteristic of the Schottky barrier are changed.

The non-covalent nano-layer is provided between the upper electrode 1 and the

P-type semiconductor 17 made of $TiO_{2+x}$ oxygen-enriched nano-materials, and the $TiO_{2+x}$ oxygen-enriched nano-layer adjacent to the non-covalent nano-layer has many negatively charged electrons, thus having the high conductivity. The N-type semiconductor 15, made of $TiO_{2-x}$ hypoxia nano-materials and adjacent to the lower electrode 2, has positively charged oxygen atom defects with the high concentration, thus having a high conductivity. However, no doping exists in the neutral nano-layer 16 made of $TiO_2$ neutral nano-materials, $TiO_2$ neutral nano-layer has a high potential barrier and conductivity, so that at the state, the ultrafast memristor has a low conductivity and is at the switch-off mode.

As shown in the left side of the energy band diagram of FIG. 10, the non-covalent contact surface Pt—$TiO_{2+x}$ of the upper electrode 1 and $TiO_{2+x}$ oxygen-enriched nano-layer 17 is adjusted by the non-covalent nano-layer. We can see from the energy band diagram that the non-covalent contact surface has the potential barrier. The electron affinity of titanium oxide is about 4.0 eV, and the work function of Pt is about 5.64 eV, so the barrier length of the non-covalent contact surface is about 1.6 eV. When the doping concentration of impurity ions is 1021 cm$^{-3}$, the exhausted length of the impurity ions in the titanium oxide is about 3 nm, the nano-layer is exhausted completely, and here, there are a lot of electrons and holes around the upper electrode 1.

Because the $TiO_{2-x}$ oxygen-enriched nano-layer 17 has a lot of electrons, and the $TiO_{2-x}$ hypoxia nano-layer 15 has a lot of holes, X of the $TiO_{2+x}$ and $TiO_{2-x}$ will have few changes. Therefore, enough electrons and holes are generated, so that the energy band of the ultrafast memristor is changed. The circumstance above mentioned is shown in FIG. 10, resulting in the bent band gap E, thus showing the higher doping concentration.

Here, the ultrafast memristor has a high barrier height, low conductivity and is at the switch-off mode. Here, if the upper electrode 1 is connected with ground, the lower electrode 2 is connected with the positive electricity, we can see that there are a lot of holes and electrons around the electrode, the electrons move from the negative electrode to the positive electrode, the holes move from the positive electrode to the negative electrode, the semiconductor band occurs bending, the barrier height is decreased, the impurity ions are prone to transition, the conductivity is improved, and the ultrafast memristor is at the intermediate state.

Figure 11:
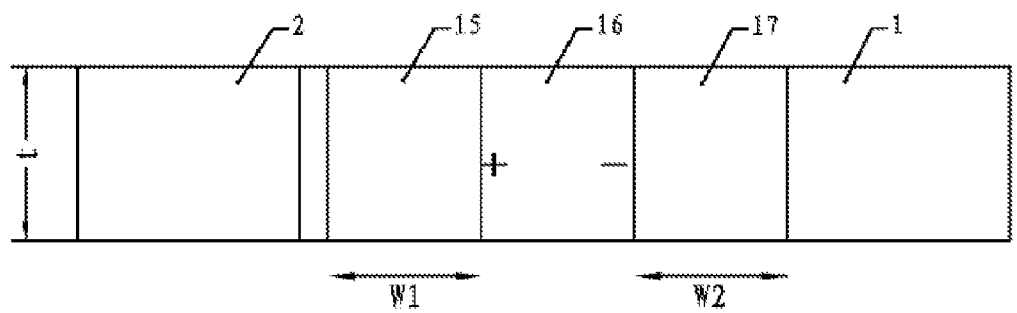
FIG. 11 is a planar schematic view of the unit switch of the nanostructure quick-switch memristor at the intermediate mode.
Figure 12:
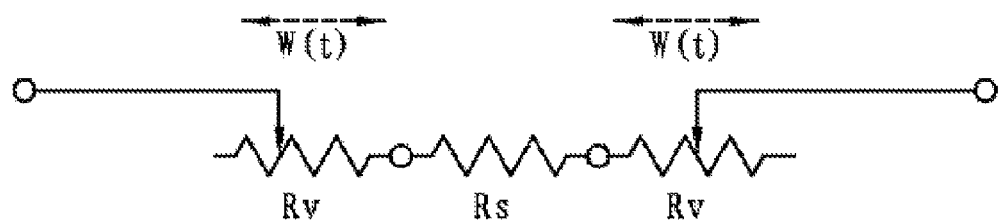
FIG. 12 is an equivalent circuit diagram of FIG. 11.
Figure 13:
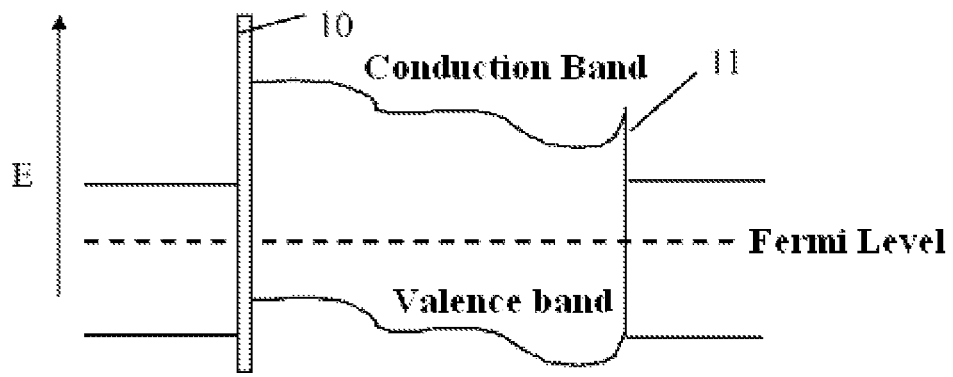
FIG. 13 is an energy band diagram of the unit switch of the nanostructure quick-switch memristor at the intermediate mode.

FIG. 11 is planar schematic view of the unit switch of the nanostructure quick-switch memristor at the intermediate mode, wherein $W_1$ and $W_2$ denote the equivalent thicknesses of the N-type semiconductor layer 15 and the P-type semiconductor layer 17, respectively. FIG. 12 is an equivalent circuit diagram of FIG. 11, wherein $W_{(t)}$ denotes the thickness of the N-type semiconductor layer 15 or the P-type semiconductor layer 17 with the change of time. FIG. 13 is an energy band diagram of the unit switch of the nanostructure quick-switch memristor at the intermediate mode.

When the N-type semiconductor layer 15 is made of $TiO_{2-x}$ hypoxia nano-materials, the neutral semiconductor layer 16 is made of $TiO_2$ neutral nano-materials, and the P-type semiconductor layer 17 is made of $TiO_{2+x}$ oxygen-enriched nano-materials, the upper electrode 1 is connected with ground, the lower electrode 2 is connected with the positive electricity, the positively charged impurity ions move from the $TiO_{2+x}$ oxygen-enriched nano-layer 17 to the $TiO_2$ neutral nano-layer 16, the negatively charged impurity ions move from the $TiO_{2-x}$ hypoxia nano-layer 15 to the $TiO_2$ neutral nano-layer 16. The energy band of the semiconductor is bent by double-injection of carriers. Seen from FIG. 13, the barrier height is decreased, carriers are prone to transit, and the conductivity is increased.

Figure 14:
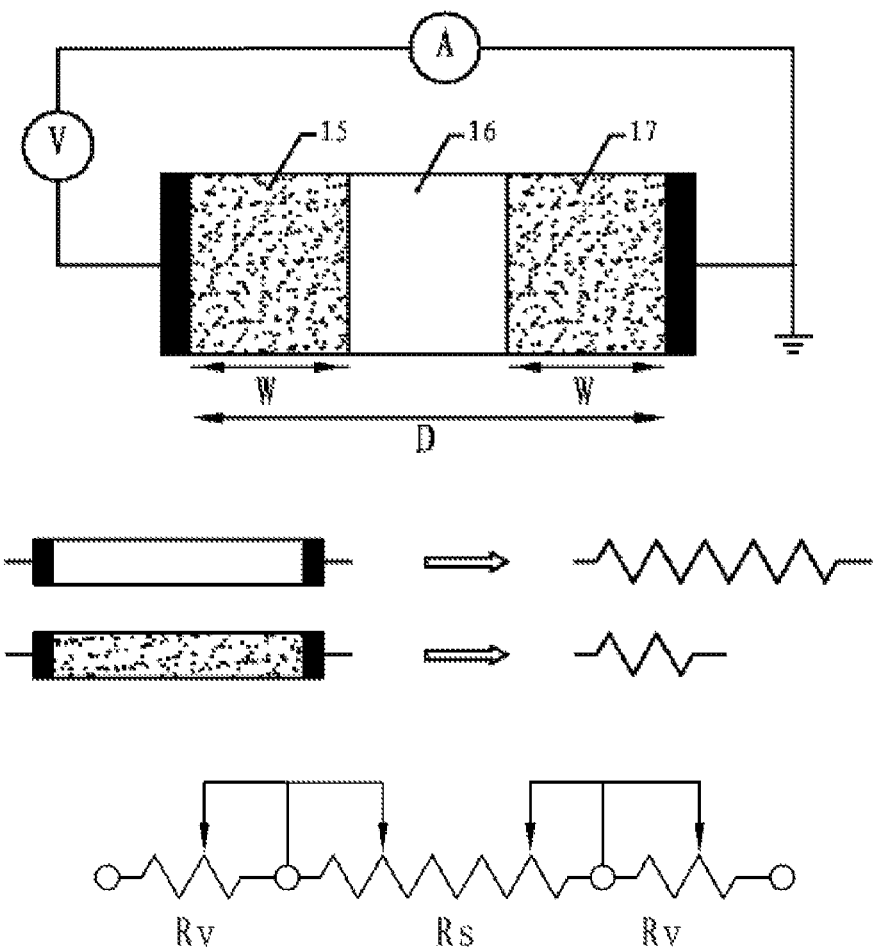
FIG. 14 is a schematic view of the inner impurity movement and equivalent resistor of the nanostructure quick-switch memristor of the present invention.

FIG. 14 is a schematic view of the movement and the equivalent resistance of inner impurities of the switch unit of the nano-structure memristor, wherein Rv denotes the equivalent resistance of the P-type semiconductor layer 17 or N-type semiconductor layer 15, and Rs denotes the equivalent resistance of the neutral semiconductor-layer 16.

Referring to FIGS. 5, 9 and 12, Rs is connected with Rv in series in the equivalent circuit, Rv is an equivalent resistance of $TiO_{2-x}$ and $TiO_{2|x}$ which changes with the time, and Rs is an equivalent resistance of $TiO_2$ nano-layer which does not change with the time. It is obtained by Ohm's Law as below.

$$V(t)=I(t)[Rs+Rv_1(t)+Rv_2(t)] \quad \text{Formula (1)},$$

wherein the resistance is in direct proportion to the length, $W_1(t)$ is the length of the $TiO_{2+x}$ nano-layer, and $W_2(t)$ is the length of the $TiO_{2-x}$ nano-layer.

$$Rv_1(t)=\rho_1 W_1(t)/A \quad \text{Formula (2)},$$

$$Rv_2(t)=\rho_2 W_2(t)/A \quad \text{Formula (3)},$$

Wherein $\rho_1$ denotes the resistance of the edge of $TiO_{2+x}$, $\rho_2$ denotes the resistance of the edge of $TiO_{2-x}$, and A is the cross-sectional area of the current passing through the nano-layer.

$$\text{When } \rho_1=\rho_2=\rho, \mu_{v1}=\mu_{v2}=\mu_v, dw/dt=-\mu_v E(t)=-\mu_v \rho I(t)/A \quad \text{Formula (4)},$$

wherein $\mu_v$ is the mobility of holes in titanium-oxide materials, E(t) is the electric field applied to two edges of intrinsic nano-layer, E(t) is equal to $\rho W(t)I(t)/A$ divided by W(t), namely, $E(t) = -\rho I(t)/A$. The length of the $TiO_2$ intrinsic nano-layer is decreased, so the result of the formula is minus. Integrate the formula 4 and obtain $$W(t) = D - \frac{2\mu_v \rho}{A} \int_0^\tau I(t) dt,  \quad \text{Formula 5}$$

wherein D is the length of $TiO_2$ intrinsic nano-layer when t=0, simplify, $$V(t) = I(t) \quad \text{Formula 6}$$
$$\left\{ R_s + \frac{R_0}{D}\left[D - \frac{\mu_{v1} t_1}{A}\int_0^\tau I(t)dt\right] + \frac{R_0}{D}\left[D - \frac{\mu_{v2}\rho}{A}\int_0^\tau I(t)dt\right] \right\},$$

Therefore, the mathematical expression of integrating the voltage and current applying to two ends of the ultrafast memristor by the time is obtained. Formula 6 is the exact express of the working conditions of the ultrafast memristor. If the ultrafast memristor has the ion drift movement, then it will be expressed by other formulas. For example, if the ion drift movement of the space charge plays a major role, then formula 6 should integrate the square of current ($I^2$) instead of current (I). Referring to FIGS. 5, 9 and 12, we can know that the ultrafast memristor is gradually turned off, W(t) and Rv(t) are decreased with the time, the total resistance of the switch of the ultrafast memristor is decreased, and the ultrafast memristor is turned on.

FIG. 10 is an energy band diagram of the ultrafast memristor at the switch-off mode. The $TiO_2$ neutral nano-layer 16 has no impurity ions, so two ends of the switch junction of the ultrafast memristor have a high barrier. It is noted that the ultrafast memristor have not only the switch-on/off modes, but the intermediate mode. According to the injection amount of the $TiO_2$ neutral nano-layer 16, the conductivity of the ultrafast memristor has a large change. Under the effect of the applied electric field, impurities can move within the junction, and the $TiO_2$ neutral nano-layer 16 obtains or loses net charges. The energy band of the semiconductor is bent by additional net charges, the barrier height is decreased, and the conductivity is increased. Furthermore, it is noted that while choosing the impurity doping source of the main working area, the proper impurity doping source can greatly improve the injection capacity of impurity into the main working layer. In generally, the ion conductor acts as the $TiO_2$ neutral nano-layer 16, namely, the impurity doping source of the main working area provides the impurity ions for the main working layer.

Referring to FIG. 13, doping impurities are injected from the $TiO_{2-x}$ hypoxia nano-layer 15 and the $TiO_{2+x}$ oxygen-enriched nano-layer 17 (the secondary working layers) into the $TiO_2$ neutral nano-layer 16 (the main working layer). Accordingly, the barrier height is decreased, the conductivity is increased, and the ultrafast memristor is at the intermediate mode. In this example, the $TiO_{2-x}$ and $TiO_{2+x}$ nano-layers are doped with enough nanocrystals, the energy band will be changed. In this period, the tunnel barrier is gradually decreased and conductivity is increased at every boundary, which is the transition period from the primary period to the switch-on/off mode.

When the bias voltage applied to two ends of the switch junction of the ultrafast memristor is increased or continued for a longer time, more carriers will be injected into the $TiO_2$ neutral nano-layer 16. Referring to FIG. 6, compared with the intermediate mode, at this mode, the electrical barrier is lower, and the conductivity is higher, and the memristor is completely switched on.

Only the resistance of the $TiO_2$ neutral nano-layer 16 is not too large, the doping impurities can be controlled to pass in or out the main work layer by changing the voltage applying to two electrodes.

We can see from the formulas mentioned above, the doping impurity source relative to the $TiO_2$ neutral nano-layer 16, namely, the doping capacity of the main working layer is the function of voltage and time, or the function of integrating the time. The voltage is larger, the ions easily cross the potential barrier. The time is longer, the accumulated doping impurities are more.

The lower electrode 2 of the ultrafast memristor is a switch-on/off electrode. The positive impurity ions are injected into the lower electrode, and the ultrafast memristor is at the switch-on mode. When the lower electrode 2 is connected with the negative electricity, the ultrafast memristor is transit to the switch-off mode. Furthermore, we can design and manufacture the ultrafast memristor having configurable polarities. For example, in the circuit including the ultrafast memristor, the switch-on/off electrode of the ultrafast memristor is determined by configuration programming which is called as the field programmable. Furthermore, we can manufacture a three-layer-membrane structure, wherein the nano-layer contacting two electrodes has no doping, and the mediate nano-layer acts as the doping source. When the electrode is connected with the negative electricity, the positive charges are attracted, so that the switch is at the switch-on mode. When the electrode is connected with the positive electricity, the positive charges are excluded, so that the switch is at the switch-off mode. This upper electrode is a switch of the switch-on/off electrode, and can be an array structure to manufacture the latch circuit. When the switch is at the switch-on mode, if the positive voltage is applied to the switch-on/off electrode for a long time, the switch-on/off electrode of the switch will be changed, and the reason is that all impurity ions drift to another electrode.

The preferred embodiment of the present invention is illustrated in FIG. 19. The nano-structure quick-switch memristor comprises a common electrode 20, two porous templates 12, a plurality of upper electrodes 1 and three layers of nano-membrane which consist of an N-type semiconductor layer 15, a neutral semiconductor layer 16 on the N-type semiconductor layer 15, and a P-type semiconductor layer 17 on the neutral semiconductor layer 16. Each of the porous templates 12 has a plurality of independent holes with nano-diameter which array in a matrix, and a plurality of nano-wires 14 passing through each hole with nano-diameter. The upper surface of one porous template 12 is connected with the lower surface of the N-type semiconductor layer 15, the lower surface of the porous template 12 is connected with the common electrode 20, the common electrode 20 is electrically connected with the N-type semiconductor layer 15 by a plurality of nano-wires 14. The lower surface of another porous template 12 is connected with the upper surface of the P-type semiconductor layer 17, a plurality of upper electrode 1 are fastened on the upper surface of the porous template 12, and each upper electrode 1 is electrically connected with the P-type semiconductor layer 17 by a nano-wire 14 within the porous template 12.

The structure of the embodiment mentioned above is an array structure of the unit switch of the nano-structure quick-switch memristor.

Figure 20:
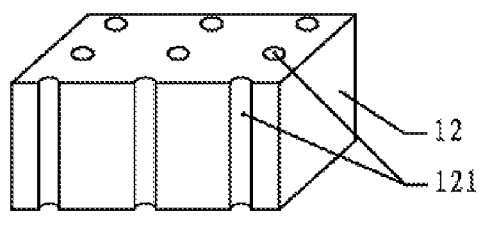
FIGS. 20 to 27 illustrate the fabrication process of the nanostructure memristor array according to the first embodiment of the present invention.

The manufacturing method of the nano-structure quick-switch memristor mentioned above is illustrated as shown in FIGS. 20 to 27, wherein FIG. 20 is a structural schematic view of the porous template 12.

Figure 21:
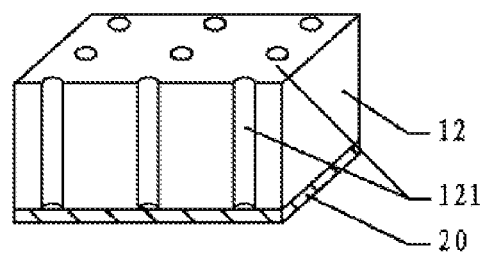
Figure 22:
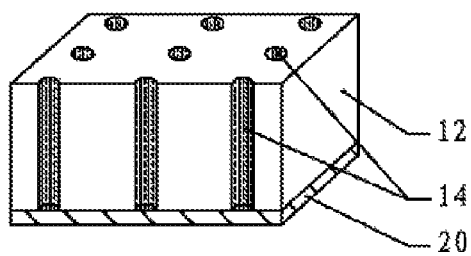
Figure 23:
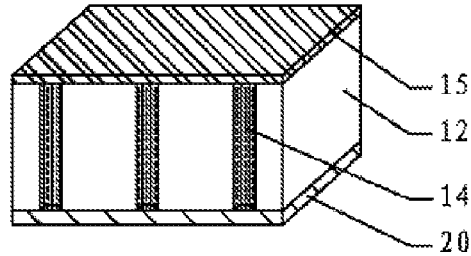
Figure 24:
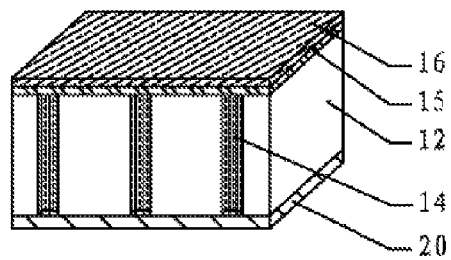
Figure 25:
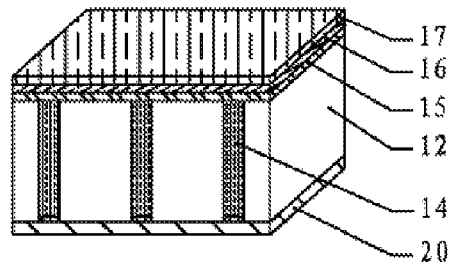
Figure 26:
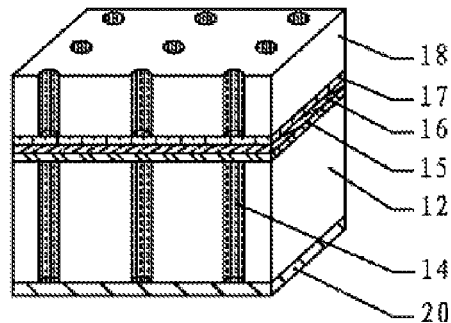
Figure 27:
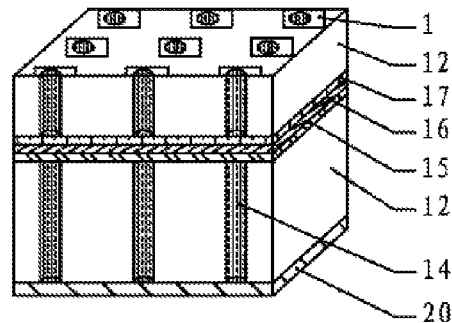

Step 1: Referring to FIG. 21, evaporating a layer of Au or Pt metal membrane on a lower surface of a porous template 12 as a common electrode 20 by the vacuum coating method;

Step 2: Welding a wire for connecting with a cathode of DC power supply on the evaporated metal membrane;

Step 3: Forming a plurality of nano-wires 14 within through-holes of the porous template 121 by putting the porous template obtained in step (2) into an electrolytic tank to electrolyze, wherein an end of each of the nano-wires 14 and an upper surface of the porous template 12 are at the same level;

Step 4: By putting the porous template obtained in step (3) into a magnetron sputtering machine, sputtering an N-type semiconductor layer 15, with a thickness of 1 nm to 33 nm, on the upper surface of the porous template 12, and then sputtering a neutral semiconductor layer 16 with a thickness of 1 nm to 33 nm, and then sputtering a P-type semiconductor layer 17 with a thickness of 1 nm to 33 nm;

Step 5: Forming an upper electrode by electrically connecting the porous template 18 having the nano-wires 14 with the P-type semiconductor layer 17 through the interface in situ alloying method;

Step 6: Forming a lower electrode by electrically connecting the porous template 12 having the nano-wires 14 with the N-type semiconductor layer 15 through the interface in situ alloying method;

Step 7: Preparing a plurality of upper electrodes of the memristor on the upper surface of the porous template 18 having the nano-wires 14 which is connected with the P-type semiconductor layer 17, by the laser etching or imprinting technology;

Step 8: Packaging the unit switch array of the nanostructure memristor obtained in steps (1) to (7) by packaging and testing technologies.

The nano-wires 14 mentioned in the embodiment can be made of Pt. Therefore, in the step (3), the electrolysis process is described as below.

The electrolytic liquid within the electrolytic tank is a mixture liquid which contains 0.01 Mol $H_2PtCl_6$ and 0.2 Mol $H_2SO_4$, is prepared by 18M deionized water, and has a PH value of 3. The porous template as the negative electrode is completely immerged into the electrolytic liquid. The metal Pt electrode as the positive electrode is provided within the electrolytic liquid and opposite to the upper surface of the porous template. The surface area of the plane which is the metal Pt electrode opposite to the porous template is larger than and equal to the surface area of the porous template. A 0.45 mA DC constant-current source is provided between the positive electrode and the negative electrode for 16 to 25 minutes. During the continuing time, a 20 Hz sinusoidal alternating electric field is applied to the electrolytic liquid and has a magnetic stirring, and the test temperature is 325K.

Under the effect of the electric and magnetic field, Pt ions in the electrolyte liquid deposit within the holes with nano-diameter of the porous template and form the Pt nano-wires. An end of each of the nano-wires and an upper surface of the porous template are at the same level.

The porous template 12 of the embodiment has a plurality of evenly distributed holes 121, each of which has a nano-diameter.

The porous template 12 can be the porous $Al_2O_3$ template with the diameter of nano-scale, or the template having holes with the diameter of nano-scale prepared by the polycarbonate synthesis method.

The N-type semiconductor layer 15 can be made of $TiO_{2-x}$ doped with Fe. The neutral semiconductor layer 16 can be made of $TiO_2$ neutral nano-materials. The P-type semiconductor layer 17 can be made of TiO2+x oxygen-enriched nano-materials.

Embodiment 2

Figure 28:
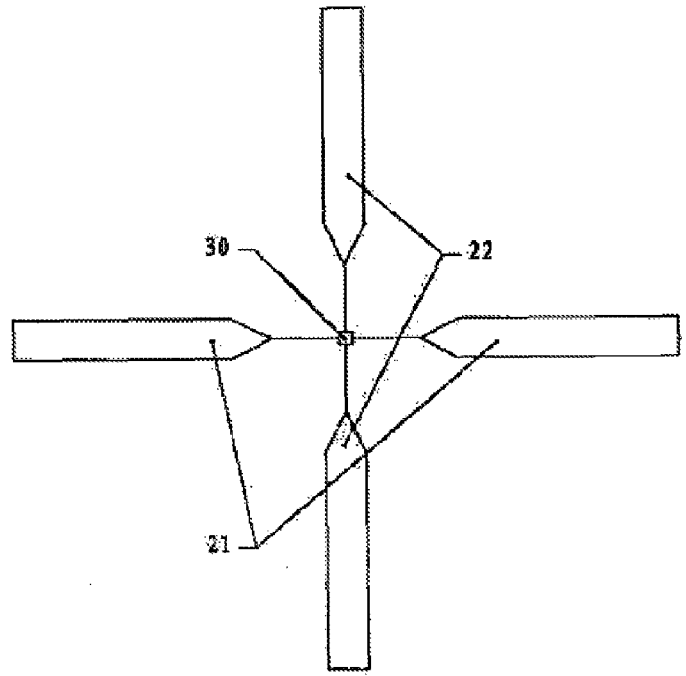
FIG. 28 is a schematic view of a nanostructure memristor according to a second embodiment of the present invention.

Referring to FIG. 28, a nano-structural quick-switch memristor according to the second preferred embodiment of the present invention is illustrated, wherein the nano-structural quick-switch memristor comprises a pair of upper electrodes 21, a pair of lower electrode 22, two nano-wires and three layers of nano-membrane 30. The pair of upper electrodes 21, the pair of lower electrodes 22 and the nano-wires center on the three layers of nano-membrane 30 to crisscrossedly arrange. The three layers of nano-membrane consist of an N-type semiconductor layer 15, a neutral semiconductor layer 16 on the N-type semiconductor layer 15, and a P-type semiconductor layer 17 on the neutral semiconductor layer 16. The P-type semiconductor layer 17 is simultaneously electrically connected with the pair of upper electrodes 21 by a nano-wire. The N-type semiconductor layer 15 is simultaneously electrically connected with the pair of lower electrodes 22 by another nano-wire.

The three layers of nano-membrane 30 of the second preferred embodiment are the same as those mentioned in the first embodiment.

The two nano-wires can be made of Pt. The Pt cross interconnect nano-wire can be prepared by Quanta 30 focused electron beam (FEB)/ion beam (FIB) double-beam induced etching system. The manufacturing method of the three layers of nano-membrane 30 is the same as that mentioned in the first embodiment.

Figure 15:
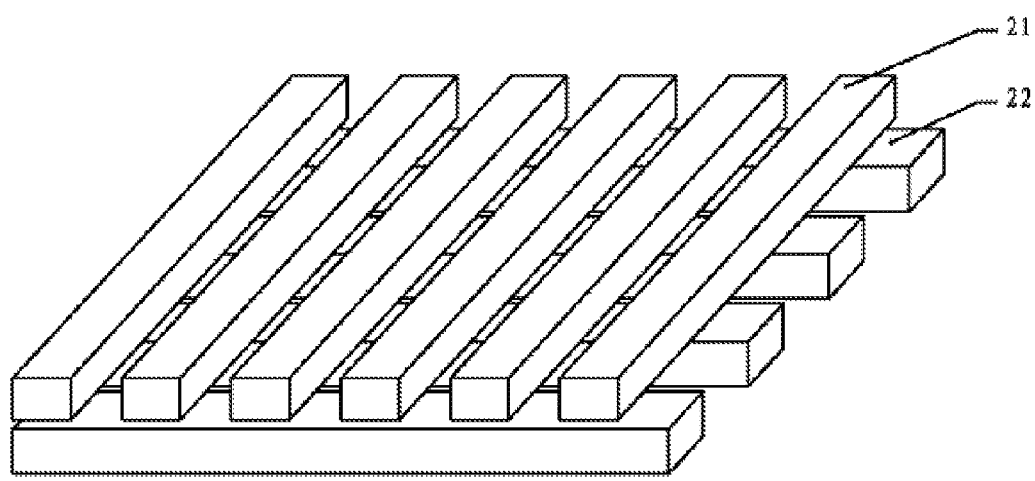
FIG. 15 is a schematic view of the nanostructure memristor array model consists of the nanostructure memristors.

The memristor array formed by the nano-structure quick-switch memristor according to the embodiment of the present invention, referring to FIG. 15, comprises a plurality of nano-structure quick-switch memristors arranged in a matrix. The upper electrodes 21 of adjacent two nano-structure quick-switch memristors are connected with each other, thus forming the upper electrode matrix. The lower electrodes 22 of adjacent two nano-structure quick-switch memristors are connected with each other, thus forming the lower electrode matrix. A three-layer of nano-membrane array is provided between the upper electrode matrix and the lower electrode matrix.

FIG. 15 shows a well-known latch structure which is a switch array consists of upper parallel line and lower parallel line. The upper parallel line and the lower parallel line intersect, thus forming the grid structure, in generally, the upper parallel line and lower parallel line are perpendicular to each other. Referring to FIG. 15, the switch junction of the three layers of nano-membranes of the ultrafast memristor is provided between the upper electrode 21 and the lower electrode 22. A plurality of upper electrodes 21 which are parallel to each other form an upper electrode array. A plurality of upper electrodes 21 which are parallel to each other form an upper electrode array. The upper electrode 21 is perpendicular to the lower electrode 22, thus forming the grid structure.

Figure 16:
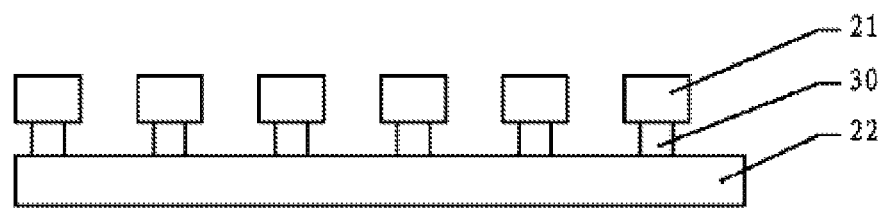
FIG. 16 is a front view of FIG. 15.
Figures 17, 18:
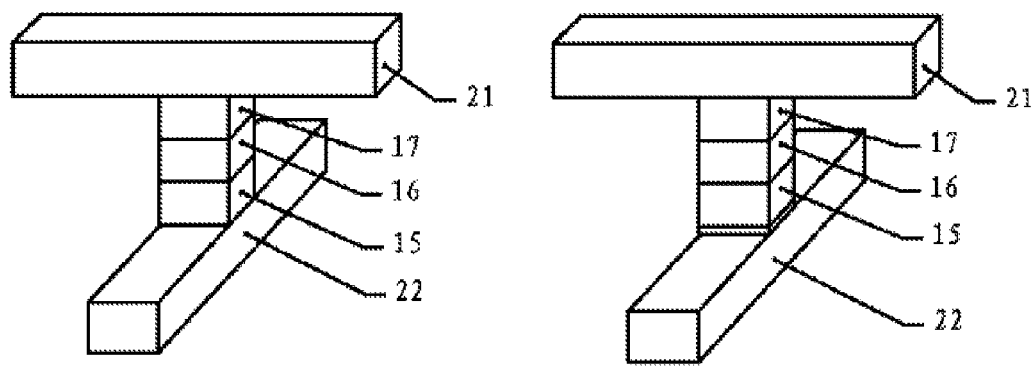
FIG. 17 is an ideal schematic view of a unit switch of the nanostructure memristor array model shown in FIG. 15.
FIG. 18 is a structural view of the unit switch having the contact potential barrier between metal and semiconductor materials shown in FIG. 17.

FIG. 16 is a front view of FIG. 15. FIG. 17 is schematic view of a unit switch of the array structure of the nano-structure memristor shown in FIG. 15, wherein the unit switch is an ideal unit structure using the crisscross configuration shown in FIG. 1. The ideal schematic view of the unit switch having the contact potential barrier 20 between metal and semiconductor is shown in FIG. 18.

The prospect for the present invention:

All in all, the ultrafast switch has a good application prospect. Compared with the structure disclosed in US20080090337A1, the present application makes up for the shortage of slow switch speed, and provides a new ultrafast memristor model and manufacturing method thereof for the upcoming faster and more energy nonvolatile computers or circuits.

What is claimed is:

1. A nanostructure quick-switch memristor, comprising:
an upper electrode, a lower electrode, and three layers of nano-membrane provided between said upper electrode and said lower electrode and consisting of an N-type semiconductor layer, a neutral semiconductor layer on said N-type semiconductor layer, and a P-type semiconductor layer on said neutral semiconductor layer, wherein said P-type semiconductor layer is electrically connected with said upper electrode, and said N-type semiconductor layer is electrically connected with said lower electrode.

2. The nanostructure quick-switch memristor, as recited in claim 1, wherein said P-type semiconductor layer is electrically connected with said upper electrode by nanowires, and said N-type semiconductor layer is electrically connected with said lower electrode by nanowires.

3. The nanostructure quick-switch memristor, as recited in claim 2, wherein said nanowires are made of Pt.

4. The nanostructure quick-switch memristor, as recited in claim 1, wherein said N-type semiconductor layer is made of $TiO_{2-x}$, hypoxia nano-materials, said neutral semiconductor layer is made of $TiO_2$ neutral nano-materials, and said P-type semiconductor layer is made of $TiO_{2+x}$ oxygen-enriched nano-materials.

5. The nanostructure quick-switch memristor, as recited in claim 2, wherein said N-type semiconductor layer is made of $TiO_{2-x}$ hypoxia nano-materials, said neutral semiconductor layer is made of $TiO_2$ neutral nano-materials, and said P-type semiconductor layer is made of $TiO_{2+x}$ oxygen-enriched nano-materials.

6. The nanostructure quick-switch memristor, as recited in claim 1, wherein each of said three layers of nano-membrane, said P-type semiconductor layer, said neutral semiconductor layer and said N-type semiconductor layer has a thickness within a range of 1 nm to 33 nm.

7. The nanostructure quick-switch memristor, as recited in claim 2, wherein each of said three layers of nano-membrane, said P-type semiconductor layer, said neutral semiconductor layer and said N-type semiconductor layer has a thickness within a range of 1 nm to 33 nm.

8. The nanostructure quick-switch memristor, as recited in claim 3, wherein each of said three layers of nano-membrane, said P-type semiconductor layer, said neutral semiconductor layer and said N-type semiconductor layer has a thickness within a range of 1 nm to 33 nm.

9. The nanostructure quick-switch memristor, as recited in claim 4, wherein each of said three layers of nano-membrane, said P-type semiconductor layer, said neutral semiconductor layer and said N-type semiconductor layer has a thickness within a range of 1 nm to 33 nm.

10. The nanostructure quick-switch memristor, as recited in claim 5, wherein each of said three layers of nano-membrane, said P-type semiconductor layer, said neutral semiconductor layer and said N-type semiconductor layer has a thickness within a range of 1 nm to 33 nm.

11. The nanostructure quick-switch memristor, as recited in claim 9, wherein a total thickness of said three layers of nano-membrane is smaller than 100 nm and larger than 3 nm.

12. The nanostructure quick-switch memristor, as recited in claim 10, wherein a total thickness of said three layers of nano-membrane is smaller than 100 nm and larger than 3 nm.

13. A nanostructure quick-switch memristor, comprising a pair of upper electrodes, a pair of lower electrodes, a first nano-wire, a second nano-wire and three layers of nano-membrane, wherein said pair of upper electrodes, said pair of lower electrodes and said first and second nano-wires center on said three layers of nano-membrane to crisscrossedly arrange with each other, wherein said three layers of nano-membrane consist of an N-type semiconductor layer, a neutral semiconductor layer on said N-type semiconductor layer, and a P-type semiconductor layer on said neutral semiconductor layer, wherein said P-type semiconductor layer is simultaneously electrically connected with said pair of upper electrodes by said first nano-wire, and said N-type semiconductor layer is simultaneously electrically connected with said pair of lower electrodes by said second nano-wire.

14. The nanostructure quick-switch memristor, as recited in claim 13, wherein said N-type semiconductor layer is made of $TiO_{2-x}$ hypoxia nano-materials, said neutral semiconductor layer is made of $TiO_2$ neutral nano-materials, and said P-type semiconductor layer is made of $TiO_{2+x}$ oxygen-enriched nano-materials.

15. The nanostructure quick-switch memristor, as recited in claim 13, wherein each of said three layers of nano-membrane, said P-type semiconductor layer, said neutral semiconductor layer and said N-type semiconductor layer has a thickness within a range of 1 nm to 33 nm.

16. The nanostructure quick-switch memristor, as recited in claim 14, wherein each of said three layers of nano-membrane, said P-type semiconductor layer, said neutral semiconductor layer and said N-type semiconductor layer has a thickness within a range of 1 nm to 33 nm.

17. The nanostructure quick-switch memristor, as recited in claim 15, wherein a total thickness of said three layers of nano-membrane is smaller than 100 nm and larger than 3 nm.

18. The nanostructure quick-switch memristor, as recited in claim 16, wherein a total thickness of said three layers of nano-membrane is smaller than 100 nm and larger than 3 nm.

* * * * *